United States Patent
Hu

(10) Patent No.: US 10,157,836 B2
(45) Date of Patent: Dec. 18, 2018

(54) METAL VIA STRUCTURE

(71) Applicant: Dyi-Chung Hu, Hsinchu (TW)

(72) Inventor: Dyi-Chung Hu, Hsinchu (TW)

( * ) Notice: Subject to any disclaimer, the term of this patent is extended or adjusted under 35 U.S.C. 154(b) by 0 days.

(21) Appl. No.: 15/807,583

(22) Filed: Nov. 9, 2017

(65) Prior Publication Data

US 2018/0068943 A1 Mar. 8, 2018

Related U.S. Application Data

(62) Division of application No. 15/370,109, filed on Dec. 6, 2016, now Pat. No. 9,859,213.

(60) Provisional application No. 62/264,086, filed on Dec. 7, 2015.

(51) Int. Cl.
| | |
|---|---|
| *H01L 21/44* | (2006.01) |
| *H01L 23/528* | (2006.01) |
| *H01L 23/532* | (2006.01) |
| *H01L 21/768* | (2006.01) |
| *H01L 23/522* | (2006.01) |

(52) U.S. Cl.
CPC ........ *H01L 23/528* (2013.01); *H01L 21/7685* (2013.01); *H01L 21/76895* (2013.01); *H01L 23/5226* (2013.01); *H01L 23/53214* (2013.01); *H01L 23/53228* (2013.01); *H01L 23/53242* (2013.01); *H01L 23/53266* (2013.01); *H01L 23/53223* (2013.01); *H01L 23/53238* (2013.01); *H01L 23/53252* (2013.01); *H01L 2224/18* (2013.01)

(58) Field of Classification Search
CPC ........... H01L 21/7685; H01L 21/76895; H01L 23/528
USPC ................................. 438/622, 629, 672, 675
See application file for complete search history.

(56) References Cited

U.S. PATENT DOCUMENTS

| | | | | |
|---|---|---|---|---|
| 5,109,267 A | * | 4/1992 | Koblinger | H01L 21/76801 257/760 |
| 5,137,845 A | * | 8/1992 | Lochon | H01L 23/53209 148/DIG. 143 |
| 5,877,078 A | * | 3/1999 | Yanagida | H01L 24/03 257/E21.508 |
| 8,466,059 B2 | * | 6/2013 | Chang | H01L 21/6835 257/E21.577 |
| 8,865,489 B2 | * | 10/2014 | Rogers | H01L 25/0753 438/27 |
| 9,627,254 B2 | * | 4/2017 | Burgess | H01L 21/76838 |
| 2005/0020047 A1 | * | 1/2005 | Mis | H01L 23/53223 438/597 |

(Continued)

*Primary Examiner* — Nitin Parekh
(74) *Attorney, Agent, or Firm* — JCIPRNET

(57) ABSTRACT

A fabrication process including the following steps for making a metal via structure is disclosed. A substrate with at least a metal pad configured thereon is prepared. A first dielectric layer configured on a top surface of the substrate has a first opening exposing a top surface of the metal pad. A patterned first photoresist having a second opening aligned with the first opening is applied on a top surface of the first dielectric layer. A first metal evaporation is performed to form a first adhesive layer conformably distributed on a wall surface of the first opening and on a top surface of the exposed area of the metal pad. A second metal evaporation is performed to form a first metal block. The first photoresist is stripped. The first metal block is flattened to have a top surface coplanar with a top surface of the first dielectric layer.

3 Claims, 3 Drawing Sheets

(56) References Cited

U.S. PATENT DOCUMENTS

| | | | | |
|---|---|---|---|---|
| 2006/0088992 A1* | 4/2006 | Huang | ............ | H01L 24/11 |
| | | | | 438/614 |
| 2011/0237004 A1* | 9/2011 | Lee | ............ | H01L 21/76898 |
| | | | | 438/15 |
| 2013/0196499 A1* | 8/2013 | Burgess | ............ | H01L 24/11 |
| | | | | 438/614 |
| 2014/0294335 A1* | 10/2014 | Yagi | ............ | G02F 1/025 |
| | | | | 385/2 |
| 2015/0028488 A1* | 1/2015 | Colonna | ............ | H01L 24/19 |
| | | | | 257/773 |

* cited by examiner

METAL VIA STRUCTURE

CROSS-REFERENCE TO RELATED APPLICATIONS

This application is a divisional application of and claims the priority benefit of U.S. application Ser. No. 15/370,109, filed on Dec. 6, 2016, now allowed, which claims the priority benefit of U.S. provisional application Ser. No. 62/264,086, filed on Dec. 7, 2015. The entirety of each of the above-mentioned patent applications is hereby incorporated by reference herein and made a part of specification.

BACKGROUND

Technical Field

The present invention relates to a metal via structure, especially relates to a filled metal via structure which has an adhesive layer lying on bottom. The adhesive layer enhances bonding forces between the metal block and a bottom element.

Description of Related Art

FIG. 1 shows a prior art.

FIG. 1 shows that US2012/0273960 discloses a semiconductor package. A semiconductor die 124 is embedded in an encapsulant 194. The semiconductor die 124 has a plurality of through silicon via (TSV) 132 within the die 124, and has a plurality of through mold via (TMV) 200 within the encapsulant 194. A top build-up structure 202 and a bottom build-up structure 210 are made for external interconnect for the semiconductor package. The top build-up structure 202 has a redistribution circuitry 204, the bottom build-up structures 210 has a redistribution circuitry 212. A plurality of solder balls 216 are configured on a bottom side of the package.

The disadvantage for the prior is that the redistribution circuitry 204 has a first conformal metal via 20A and a second metal via 20B. An offset 22 is needed between the first metal via 20A and 20B in a lateral side. The offset 22 needs more space for circuitry layout and consumes more substrate area. It is a long desire to enhance circuit density higher and higher in the semiconductor device technology. It is noticed that the offset between two metal vias not only wastes substrate used but also reduces circuit density.

BRIEF DESCRIPTION OF THE DRAWINGS

FIGS. 2A-2J show a fabrication process embodiment according to the present invention.

DETAILED DESCRIPTION OF THE INVENTION

A filled metal via having an adhesive layer configured on bottom is disclosed. The adhesive layer enhances bonding force between the filled metal via and a bottom element. Further, stacked metal vias can be made to not only save spaces but also enhance circuit density for an electronic device. A shorter circuit not only enhances signal intensity but also lessens signal transmission time.

The adhesive layer according to the present invention has a thickness roughly of 0.3 um and can be made as thick as 1 um depending on design choices. The metal circuit according to the present invention can be one of Gold (Au), Silver (Ag), Copper (Cu), Aluminum (Al) or equivalents. The adhesive layer according to the present invention can be one of Titanium (Ti), Chromium (Cr), Niobium (Nb), Tungsten (W), and Titanium Tungsten (TiW).

FIGS. 2A-2J show a fabrication process embodiment according to the present invention.

Figure 1:
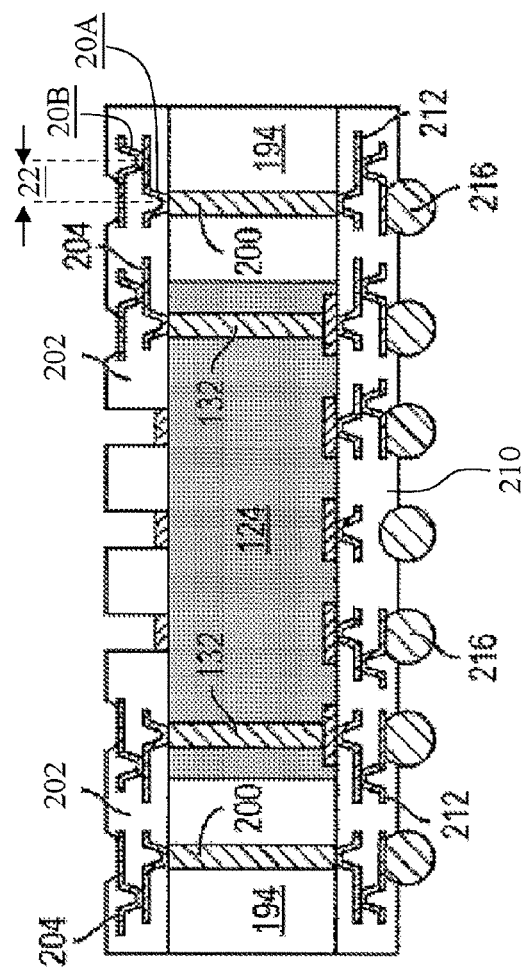
FIG. 1 shows a prior art.
Figure 2A:
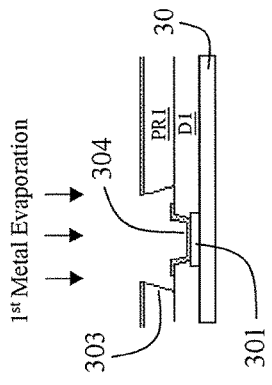

FIG. 2A shows: preparing a substrate 30 with at least a metal pad 301 configured thereon; a first dielectric layer D1 is configured on a top surface of the substrate 30; the first dielectric layer D1 has a first opening 302 and the metal pad 301 has a top surface exposed from the opening 302 of the first dielectric layer D1. The metal pad 301 as shown in the figure is an example only, which can be replaced by a metal circuit or a metal pillar such as a through silicon via (TSV), through glass via (TGA), or a through mold via (TMV) . . . etc.

Figure 2B:
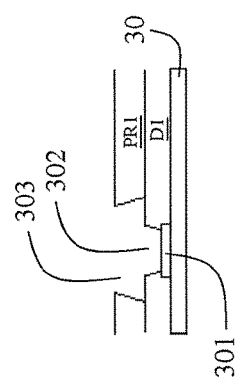
Figure 2C:
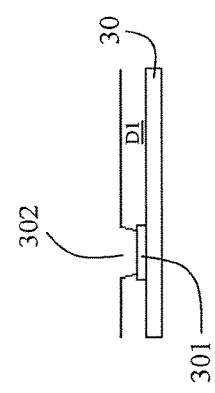
Figure 2D:
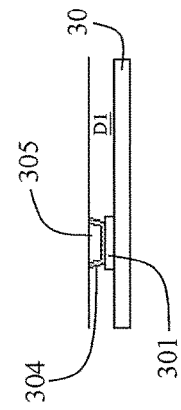
Figure 2E:
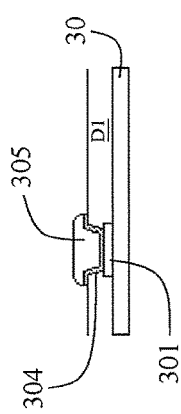
Figure 2F:
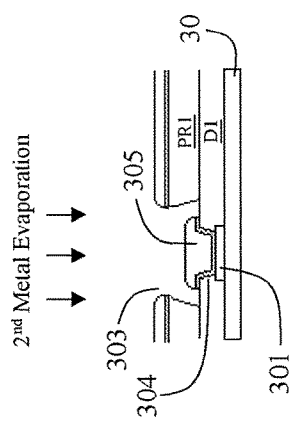
Figure 2H:
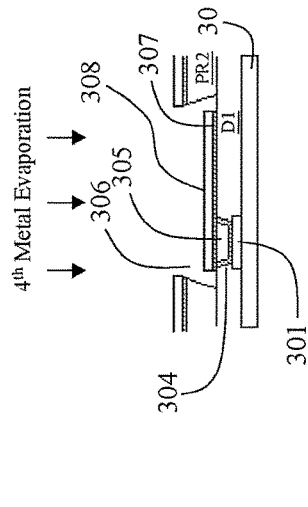
Figure 2I:
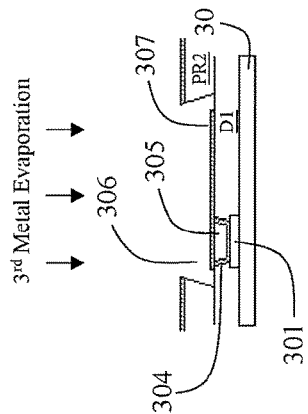
Figure 2J:
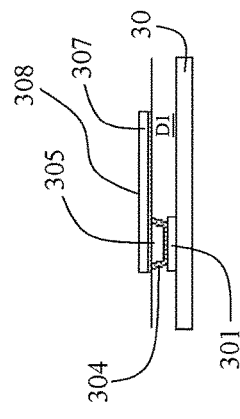

FIG. 2B shows: applying a patterned first photoresist PR1 on a top surface of the first dielectric layer D1, the first photoresist PR1 has a second opening 303 aligned with the first opening 302;

FIG. 2C shows: performing a first metal evaporation to form a first adhesive layer 304, the first adhesive layer 304 is conformably distributed on a wall surface of the first opening 302 and on a top surface of the exposed area of the metal pad 301;

FIG. 2D shows: performing a second metal evaporation to form a first metal block 305 on a top surface of the first adhesive layer 304;

FIG. 2E shows: stripping the first photoresist PR1;

FIG. 2F shows: flattening the first metal block 305 so that the first metal block 305 has a top surface coplanar with a top surface of the first dielectric layer D1;

FIG. 2G shows: applying a patterned second photoresist PR2, the second photoresist PR2 has a third opening 306 which covers at least a top surface of the first metal block 305;

FIG. 2H shows: performing a third metal evaporation to form a second adhesive layer 307 on a top surface of the first dielectric layer D1; the second adhesive layer 307 covers at least a top surface of the first metal block 305;

FIG. 2I shows: performing a fourth metal evaporation to form a first metal circuit 307 on a top surface of the second adhesive layer 307;

FIG. 2J shows: stripping the second photoresist PR2.

Figure 3:
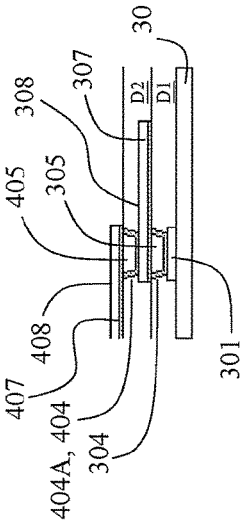
FIG. 3 shows a modified embodiment according to the present invention.

FIG. 3 shows a modified embodiment according to the present invention.

A second metal via structure can be made and stacked on a top surface of the first metal via through a similar fabrication process.

FIG. 3 shows: forming a second dielectric layer D2 on a top surface of the first metal circuit 308; the second dielectric layer D2 has an opening 404A aligned with the first metal block 305; the opening 404A exposes an area of the first metal circuit 308;

forming a third adhesive layer 404 to cover at least a top surface of the exposed area 404 of the first metal circuit 308;

forming a second metal block 405 on a top surface of the third adhesive layer so that the second metal block 405 is aligned with the first metal block 305; wherein the second metal block 405 has a top surface coplanar with a top surface of the second dielectric layer D2;

forming a fourth adhesive layer 407 on a top surface of the second dielectric layer D2; the fourth adhesive layer 407 has a first end extended to cover a top surface of the second metal block 405; and forming a second metal circuit 408 on a top surface of the fourth adhesive layer 407.

While several embodiments have been described by way of example, it will be apparent to those skilled in the art that various modifications may be configured without departs from the spirit of the present invention. Such modifications are all within the scope of the present invention, as defined by the appended claims.

NUMERICAL SYSTEM

30 substrate
301 metal pad
302 first opening
303 second opening
304 first adhesive layer
305 first metal block
306 third opening
307 second adhesive layer
308 first metal circuit
404 third adhesive layer
404A opening
405 second metal block
407 fourth adhesive layer
408 second metal circuit
D1 first dielectric layer
D2 second dielectric layer
PR1 first photoresist
PR2 second photoresist

What is claimed is:

1. A fabrication process for making a metal via structure, comprising:

preparing a substrate with at least a metal pad configured thereon; a first dielectric layer configured on a top surface of the substrate; the first dielectric layer has a first opening, and the metal pad has a top surface exposed from the first opening of the first dielectric layer;

applying a patterned first photoresist on a top surface of the first dielectric layer, the patterned first photoresist has a second opening aligned with the first opening;

performing a first metal evaporation to form a first adhesive layer, the first adhesive layer is conformably distributed on a wall surface of the first opening and on the top surface of the metal pad exposed from the first opening of the first dielectric layer;

performing a second metal evaporation to form a first metal block on a top surface of the first adhesive layer;

stripping the patterned first photoresist; and flattening the first metal block so that the first metal block has a top surface coplanar with the top surface of the first dielectric layer.

2. The fabrication process as claimed in claim 1, further comprising:

applying a patterned second photoresist, the patterned second photoresist has a third opening which covers at least the top surface of the first metal block;

performing a third metal evaporation to form a second adhesive layer on the top surface of the first dielectric layer, the second adhesive layer covers at least the top surface of the first metal block; and performing a fourth metal evaporation to form a first metal circuit on a top surface of the second adhesive layer.

3. The fabrication process as claimed in claim 2, further comprising:

forming a second dielectric layer on a top surface of the first metal circuit; the second dielectric layer has an opening aligned with the first metal block; the opening of the second dielectric layer exposes an area of the first metal circuit;

forming a third adhesive layer to cover at least area of the first metal circuit exposed from the opening of the second dielectric layer;

forming a second metal block on a top surface of the third adhesive layer so that the second metal block is aligned with the first metal block; wherein the second metal block has a top surface coplanar with a top surface of the second dielectric layer;

forming a fourth adhesive layer on the top surface of the second dielectric layer, the fourth adhesive layer has a first end extended to cover the top surface of the second metal block; and forming a second metal circuit on a top surface of the fourth adhesive layer.

* * * * *